United States Patent
Zhang et al.

(10) Patent No.: US 9,607,885 B2
(45) Date of Patent: Mar. 28, 2017

(54) SEMICONDUCTOR DEVICE AND FABRICATION METHOD

(71) Applicant: Semiconductor Manufacturing International (Shanghai) Corporation, Shanghai (CN)

(72) Inventors: Peter Zhang, Shanghai (CN); Steven Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 188 days.

(21) Appl. No.: 14/178,611

(22) Filed: Feb. 12, 2014

(65) Prior Publication Data

US 2014/0306352 A1   Oct. 16, 2014

(30) Foreign Application Priority Data

Apr. 10, 2013  (CN) .......................... 2013 1 0123423

(51) Int. Cl.
| | | |
|---|---|---|
| *H01L 21/311* | (2006.01) | |
| *H01L 21/768* | (2006.01) | |
| *H01L 23/535* | (2006.01) | |
| *H01L 23/522* | (2006.01) | |
| *H01L 21/033* | (2006.01) | |

(52) U.S. Cl.
CPC .... *H01L 21/76816* (2013.01); *H01L 21/0337* (2013.01); *H01L 21/31144* (2013.01); *H01L 21/76879* (2013.01); *H01L 23/5226* (2013.01); *H01L 23/535* (2013.01); *H01L 2924/0002* (2013.01)

(58) Field of Classification Search
CPC ............. H01L 21/311; H01L 21/31144; H01L 21/76816; H01L 21/76802; H01L 21/0337
USPC .................................................. 438/694, 696
See application file for complete search history.

(56) References Cited

U.S. PATENT DOCUMENTS

| | | | | |
|---|---|---|---|---|
| 5,747,369 A | * | 5/1998 | Kantimahanti | ......... H01L 28/40 257/E21.008 |
| 6,063,688 A | * | 5/2000 | Doyle | .................... B82Y 10/00 257/E21.038 |
| 2008/0122125 A1 | * | 5/2008 | Zhou | ................... H01L 21/3088 257/797 |
| 2009/0323385 A1 | * | 12/2009 | Scheuerlein | .......... H01L 27/101 365/51 |

(Continued)

*Primary Examiner* — Jerome Jackson, Jr.
*Assistant Examiner* — John Lin
(74) *Attorney, Agent, or Firm* — Anova Law Group, PLLC

(57) ABSTRACT

Various embodiments provide semiconductor devices and fabrication methods. In an exemplary method, a dielectric layer can be formed on a semiconductor substrate. A plurality of pillar structures having a matrix arrangement can be formed on the dielectric layer. A plurality of sidewall spacers can be formed on the dielectric layer. Each sidewall spacer can be formed on a sidewall surface of one of the plurality of pillar structures. A distance between adjacent pillar structures in a same row or in a same column can be less than or equal to a double of a thickness of the each sidewall spacer on the sidewall surface. The plurality of pillar structures can be removed. The dielectric layer can be etched using the plurality of sidewall spacers as an etch mask to form a plurality of trenches or through holes in the dielectric layer.

15 Claims, 9 Drawing Sheets

(56) References Cited

U.S. PATENT DOCUMENTS

| | | | |
|---|---|---|---|
| 2011/0001243 A1* | 1/2011 | Sel | H01L 21/76816 257/773 |
| 2011/0124196 A1* | 5/2011 | Lee | H01L 21/0337 438/696 |
| 2014/0239454 A1* | 8/2014 | Cai | H01L 21/02002 257/619 |

* cited by examiner

SEMICONDUCTOR DEVICE AND FABRICATION METHOD

CROSS-REFERENCES TO RELATED APPLICATIONS

This application claims priority to Chinese Patent Application No. CN201310123423.8, filed on Apr. 10, 2013, the entire contents of which are incorporated herein by reference.

FIELD OF THE DISCLOSURE

The present disclosure relates to the field of semiconductor technology and, more particularly, relates to semiconductor devices and fabrication methods thereof.

BACKGROUND

In semiconductor manufacturing industry, photolithography techniques usually need to be used to transfer circuit patterns onto single-crystal surfaces or into dielectric layers in order to form effective pattern windows or functional patterns. Specifically, photolithography techniques may be implemented using photo-chemical reaction principles and chemical or physical etching methods.

In order to increase integration density of semiconductor devices and form structures with nanometer-scale dimensions, high-resolution photolithography techniques have been widely used. However, resolution of conventional photolithography techniques has reached its theoretical limitations. In order to overcome limitations of the theoretical resolution of conventional photolithography techniques, a variety of double-patterning processes have been developed including, e.g., litho-etch-litho-etch (LELE) and litho-litho-etch (LLE) photolithography techniques. However, with decrease in pattern dimensions on photo masks corresponding to trenches or through holes, photo mask fabrication has become more complex and more difficult. Accordingly, when through holes or trenches are fabricated to form metal plugs or metal interconnects, the through holes or trenches may have to be fabricated at a low density of arrangement. This cannot meet the requirements for high density and small size for semiconductor devices. In addition, in the existing technology, processes are complicated and have high manufacturing cost.

Therefore, it is desirable to increase density of through holes or trenches for forming semiconductor devices.

BRIEF SUMMARY OF THE DISCLOSURE

One aspect of the present disclosure includes a method for fabricating a semiconductor device. A semiconductor substrate can be provided. A dielectric layer can be formed on the semiconductor substrate. A plurality of pillar structures having a matrix arrangement can be formed on the dielectric layer. Further, a plurality of sidewall spacers can be formed on the dielectric layer. Each sidewall spacer of the plurality of sidewall spacers can be formed on a sidewall surface of one of the plurality of pillar structures. A distance between two adjacent pillar structures in a same row or in a same column can be less than or equal to a double of a thickness of the each sidewall spacer on the sidewall surface. Still further, the plurality of pillar structures can be removed. The dielectric layer can be etched using the plurality of sidewall spacers as an etch mask to form a plurality of trenches or through holes in the dielectric layer.

Another aspect of the present disclosure includes a semiconductor device. The devices can include a semiconductor substrate, a dielectric layer on the semiconductor substrate and a plurality of trenches or through holes formed in the dielectric layer. The plurality of trenches or through holes can be formed using a self-aligned double patterning process. In the self-aligned double patterning process, a plurality of pillar structures having a matrix arrangement can be formed on the dielectric layer. A plurality of sidewall spacers can be formed on the dielectric layer. Each sidewall spacer of the plurality of sidewall spacers can be formed on a sidewall surface of one of the plurality of pillar structures. A distance between two adjacent pillar structures in a same row or in a same column can be less than or equal to a double of a thickness of the each sidewall spacer on the sidewall surface. Further, the plurality of pillar structures can be removed. The dielectric layer can be etched using the plurality of sidewall spacers as an etch mask to form the plurality of trenches or through holes in the dielectric layer.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Although current litho-etch-litho-etch (LELE) technique can be used to form a plurality of through holes or trenches with a decreasing size and an increasing density, photo mask fabrication has become more complex and more difficult. In addition, via-to-via overlay issue may exist in overlay control. To solve this and other problems, various disclosed embodiments provide semiconductor device and methods for fabricating the semiconductor devices. An exemplary method includes a self-aligned double patterning process for dense via formation.

According to various embodiments, there is no need to fabricate high-density mask patterns directly on a photo mask. Instead, sidewall spacers can be formed on sidewall surfaces of pillar structures which are arranged in a matrix (i.e., having a matrix arrangement). By controlling factors including size of the sidewall spacers, shape and size of the pillar structures, etc., the sidewall spacers between two adjacent pillar structures in a same row or in a same column can be connected. Accordingly, a through hole can be formed in between the sidewall spacers of every four pillar structures that are arranged in a sub-matrix (i.e., a portion of the matrix that includes the four pillar structures). Subsequently, the pattern corresponding to the through holes (formed between the sidewall spacers) and the pillar structures can be transferred into a dielectric layer. More trenches or through holes can be formed in the dielectric layer. Therefore, the density of trenches or through holes can be increased while maintaining the small size of trenches or through holes. In addition, difficulty of photo mask fabrication can be reduced, process steps can be simplified, and manufacturing cost can be reduced. Via-to-via overlay issue in overlay control can also be eliminated.

In accordance with various disclosed embodiments, various types of vias (e.g., blind vias, buried vias, through hole vias, etc.) can be formed in the dielectric layer, which is not limited in the present disclosure. When a metal material fills the vias, metal via plugs (or metal plugs) can be formed. For illustration purposes, through hole vias (or through holes) are described herein as an example, although other types of vias, through-holes, trenches and/or openings can be encompassed in accordance with various disclosed embodiments. For example, trenches can also be formed in the dielectric layer without limitation. When a metal material fills the trenches, metal interconnect lines (or metal lines, or interconnects) can be formed.

Figure 1:
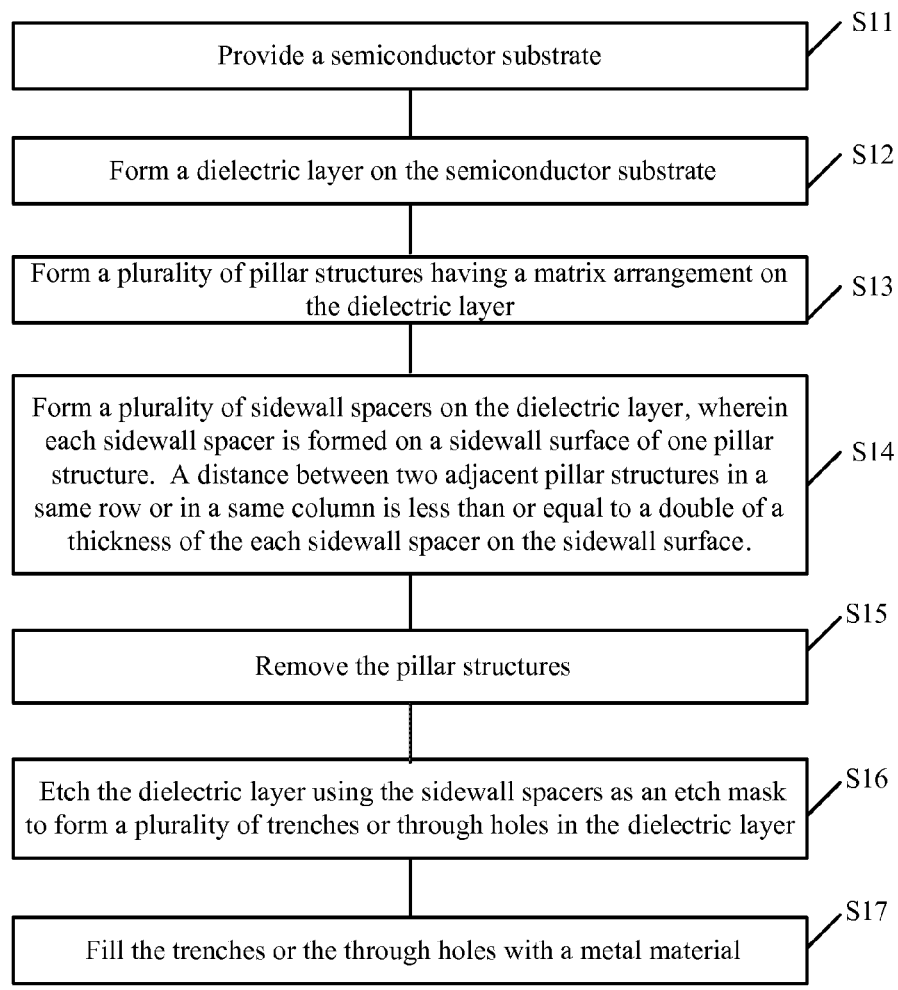
FIG. 1 depicts a flow diagram of an exemplary semiconductor device fabrication method in accordance with various disclosed embodiments.

FIG. 1 depicts a flow diagram of an exemplary semiconductor device fabrication method, while FIGS. 2-16 depict corresponding structures of the semiconductor device in accordance with various disclosed embodiments. Note that although FIGS. 2-16 depict semiconductor structures corresponding to the method depicted in FIG. 1, the semiconductor structures and the method are not limited to one another in any manner.

Figure 2:
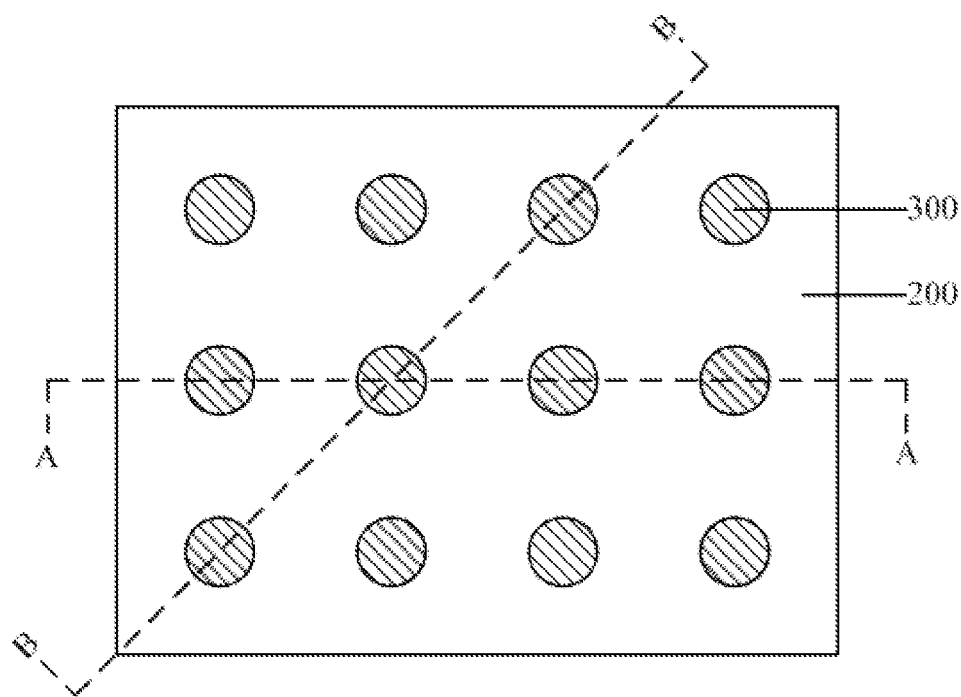
FIG. 2 depicts a top view of an exemplary semiconductor device including pillar structures in accordance with various disclosed embodiments.
Figure 3:
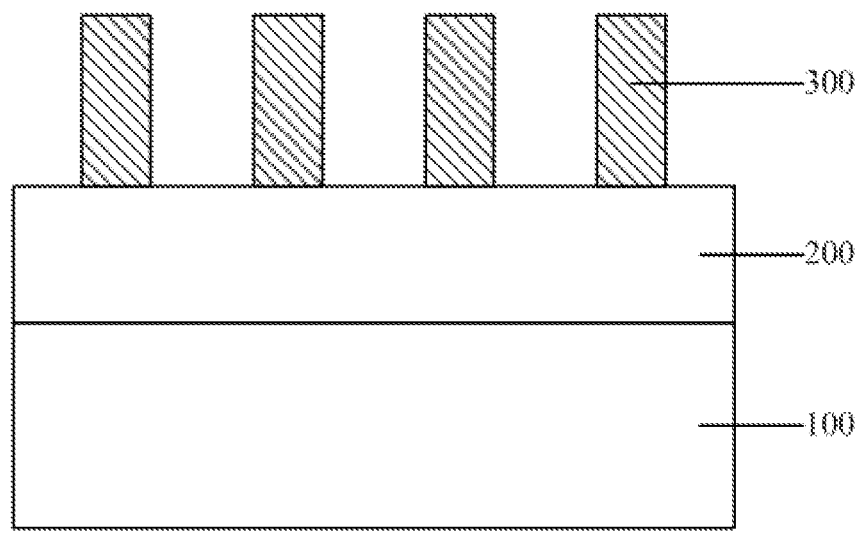
FIG. 3 depicts a cross-sectional view of the exemplary semiconductor device along an AA direction as shown in FIG. 2 in accordance with various disclosed embodiments.
Figure 4:
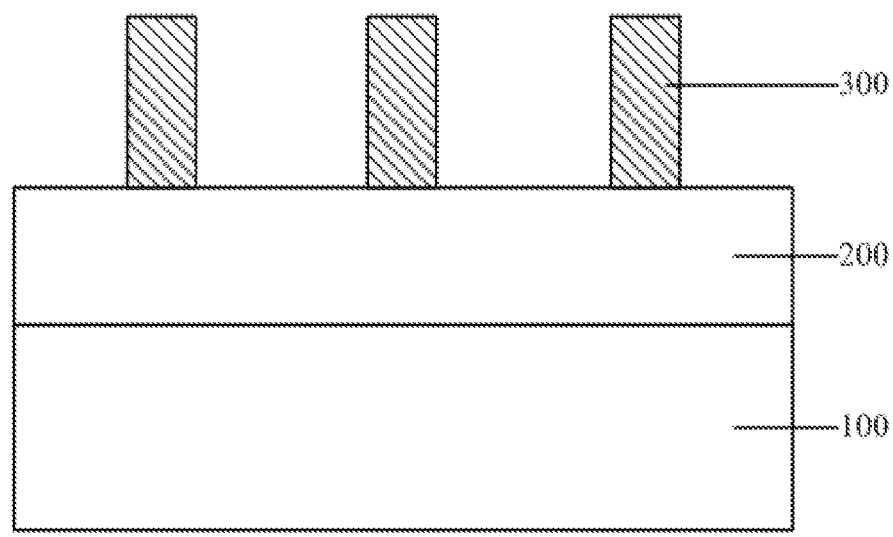
FIG. 4 depicts a cross-sectional view of the exemplary semiconductor device along a BB direction as shown in FIG. 2 in accordance with various disclosed embodiments.

For example, FIG. 2 depicts a top view of an exemplary semiconductor device after the formation of pillar structures in accordance with various disclosed embodiments. FIG. 3 depicts a cross-sectional view of the exemplary semiconductor device along an AA direction as shown in FIG. 2. FIG. 4 depicts a cross-sectional view of the exemplary semiconductor device along a BB direction as shown in FIG. 2.

Referring to FIGS. 2-4, a semiconductor substrate 100 is provided (e.g., in Step S11 of FIG. 1), a dielectric layer 200 is formed on the semiconductor substrate 100 (e.g., in Step S12 of FIG. 1), and a plurality of pillar structures 300 arranged in a matrix are formed on the dielectric layer 200 (e.g., in Step S13 of FIG. 1).

The semiconductor substrate 100 can be made of a material including, e.g., one or more of single-crystal silicon, polycrystalline silicon, amorphous silicon, silicon-germanium, and silicon-on-insulator (SOI).

In one embodiment, before forming the dielectric layer 200, one or more device layers (e.g., metal-oxide-silicon (MOS) transistors, resistors, capacitors, etc.), metal interconnect structures, or other suitable structures can be formed in the semiconductor substrate 100 without limitation.

The dielectric layer 200 can be made of a material including one or more of silicon oxide, borosilicate glass, phosphosilicate glass, and borophosphosilicate glass. The dielectric layer 200 can be made of a low-K material including, e.g., black diamond and/or other low-K materials, and can also be made of an ultra-low-K material including, e.g., SiOCH (or carbon-containing silicon oxide) and/or other ultra-low-K materials. In one embodiment, the dielectric layer 200 can be made of silicon oxide ($SiO_2$).

The dielectric layer 200 can be formed by a process of chemical vapor deposition (CVD), physical vapor deposition (PVD), atomic layer deposition (ALD), sputtering, etc. without limitation.

A plurality of pillar structures 300 having a matrix arrangement can be formed on the dielectric layer 200. For example, on an upper surface of the dielectric layer 200, M parallel rows of pillar structures 300 and N parallel columns of pillar structures 300 can be simultaneously formed. In various embodiments, M can be an integer greater than 1. N can be an integer greater than 1. M and N can be the same or different.

For illustration purposes, FIG. 2 shows about 12 pillar structures arranged in 3 rows by 4 columns, although the pillar structures can be more or less than 12 and arranged in any suitable manner in accordance with various embodiments.

A cross section of each pillar structure 300 can have a shape that is circular, oval, diamond, and/or other suitable shape without limitation, as long as the following results can be accomplished. A sidewall spacer (e.g., a sidewall spacer 400 in FIGS. 5-7) is subsequently formed on the sidewall surface of each of the pillar structures 300 and on the dielectric layer 200. A gap (e.g., a through hole 500 in FIG. 7) between the sidewall spacers corresponding to every four adjacent pillar structures 300 in the two adjacent rows and the two adjacent columns (i.e., the through hole) can correspond to a size of a metal plug or interconnect. Adjacent pillar structures 300 in the same row or the same column can be connected by corresponding sidewall spacers.

The pillar structures 300 can be made of a material including one or more of a photoresist material, a bottom-anti-reflective material (e.g., silicon oxide formed by tetra-ethyl orthosilicate (TEOS)), an amorphous carbon, silicon oxide (e.g., formed by a chemical vapor deposition process), silicon nitride, silicon oxynitride, silicon carbide, silicon carbonitride, titanium nitride, and copper nitride. In some embodiments, the pillar structures 300 can be made of a photoresist material, silicon oxide formed by TEOS, and/or amorphous carbon. In this case, the pillar structures 300 can be subsequently removed by an ashing process. In other embodiments, the column structures 300 can be made of other materials and a corresponding etching process can be subsequently used to remove the pillar structures 300.

The pillar structures 300 can have a same or different shape (and/or size). A distance between adjacent pillar structures 300 in a same row (and/or in a same column) can be the same or different. For example, the distance between every two adjacent pillar structures 300 in a row can be the same as or different from the distance between every two adjacent pillar structures 300 in a column. In one embodiment, the size and shape of each one of the pillar structures 300 can be the same, and the distance between adjacent pillar structures 300 in a same row and/or a same column can be the same. In this case, the fabrication process can be simplified, and the fabrication cost can be reduced.

In one embodiment, the pillar structures 300 can be cylinders, and can be made of a negative photoresist material. A diameter of each of the cylinders can range from about 10 nm to about 180 nm, e.g., about 10 nm, about 50 nm, about 120 nm, or about 180 nm.

In one embodiment, the pillar structures 300 can be formed using the following method. First, a negative photoresist material is coated on the dielectric layer 200. Next, regions where the pillar structures 300 need to be formed are exposed. The photoresist material is then developed and portions of the photoresist material are removed from unexposed regions. Remaining photoresist material can form the pillar structures 300. In another embodiment, the pillar structures 300 materials can be made of a positive photoresist material.

Figure 5:
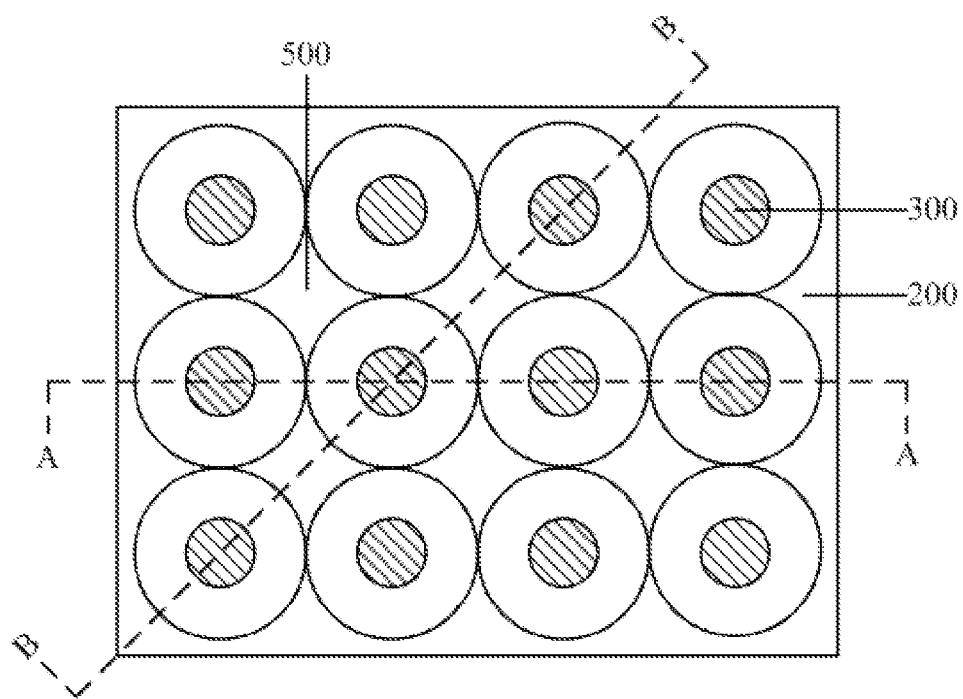
FIG. 5 depicts a top view of an exemplary semiconductor device including sidewall spacers in accordance with various disclosed embodiments.
Figure 6:
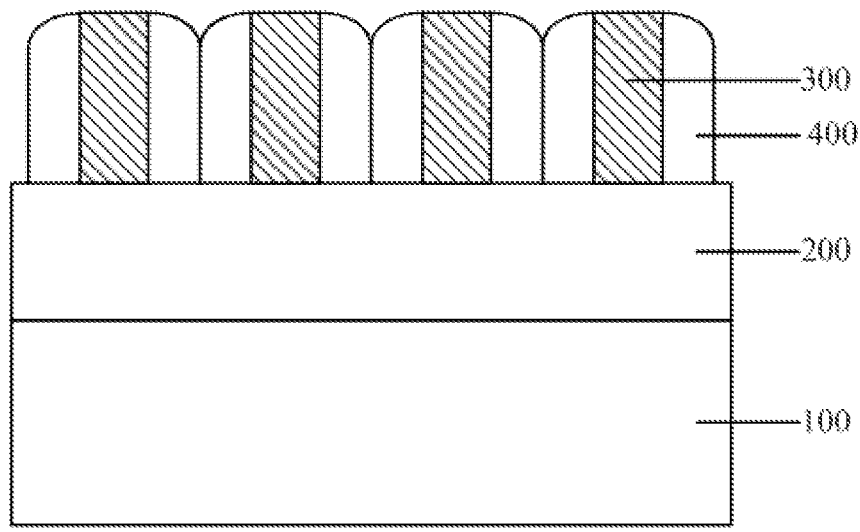
FIG. 6 depicts a cross-sectional view of the exemplary semiconductor device along an AA direction as shown in FIG. 5 in accordance with various disclosed embodiments.
Figure 7:
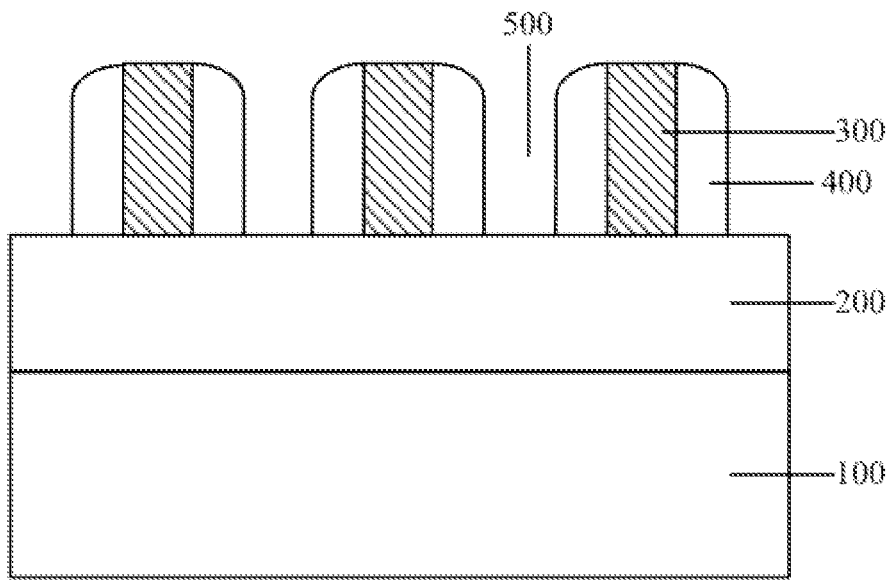
FIG. 7 depicts a cross-sectional view of the exemplary semiconductor device along a BB direction as shown in FIG. 5 in accordance with various disclosed embodiments.

FIG. 5 depicts a top view of an exemplary semiconductor device after forming sidewall spacers in accordance with various disclosed embodiments. FIG. 6 depicts a cross-sectional view of the exemplary semiconductor device along an AA direction as shown in FIG. 5. FIG. 7 depicts a cross-sectional view of the exemplary semiconductor device along a BB direction as shown in FIG. 5.

In Step S14 of FIG. 1 and referring to FIGS. 5-7, a sidewall spacer 400 is formed on the dielectric layer 200 and on a sidewall surface of each of the pillar structures 300.

For example, using an ALD process, a sidewall spacer material can be formed on a surface of the dielectric layer 200 and on the sidewall surface of each of the pillar structures 300. In a sidewall spacer forming process (e.g., any suitable process known in the art), a portion of the sidewall spacer material can be etched away to leave a portion of the sidewall spacer that is both on the dielectric layer 200 and on the sidewall surface of each of the pillar structures 300.

The sidewall spacers 400 and the pillar structures 300 may be made of different materials, because subsequently the pillar structures 300 may be removed first and the sidewall spacers 400 may need to be retained. For example, the sidewall spacers 400 can be made of a material including one or more of silicon oxide, silicon nitride, silicon oxynitride, silicon carbide (or SiC), silicon carbonitride (or SiCN), titanium nitride (or TiN), and copper nitride (or Cu$_3$N).

The sidewall spacer 400 can have a thickness that the double of the thickness is greater than or equal to the distance between two adjacent pillar structures 300 in a same row or a same column. As a result, after the sidewall spacers 400 are formed, the sidewall spacers 400 of every two adjacent pillar structures 300 in the same row or the same column can be connected. However, a gap can be formed between the sidewall spacers 400 of two adjacent pillar structures 300 in a diagonal direction. In this manner, the gap can be formed between every four sidewall spacers 400 corresponding to every four pillar structures 300 in the two adjacent rows and the two adjacent columns (e.g., arranged as a sub-matrix). Each gap can be used as a through hole 500 as shown in FIG. 7. By properly controlling the shape and size of the pillar structures 300 and the sidewall spacers 400, the position, shape, and size of the through holes 500 can be precisely controlled, such that the through holes 500 can correspond to the position, shape, and size of subsequently-formed metal plugs or metal interconnects.

Figure 11:
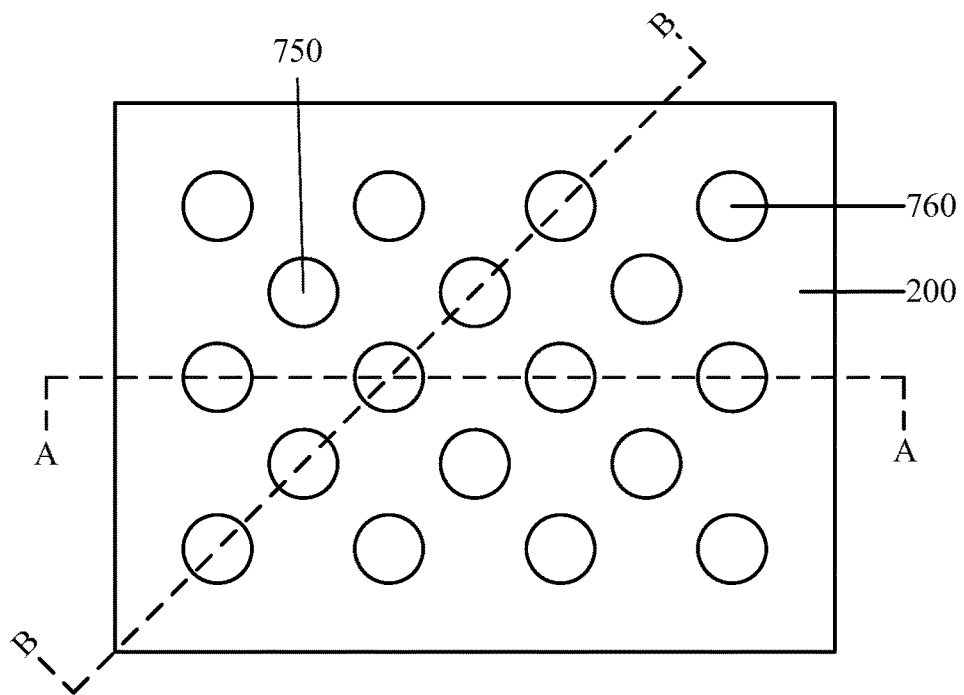
FIG. 11 depicts a top view of an exemplary semiconductor device after etching a dielectric layer in accordance with various disclosed embodiments.

In some cases, a transfer loss may occur during a pattern transfer process. The through holes 500 can be formed having an irregular shape, e.g. similar to a rectangle, which can then be changed toward a circular shape when transferred into the dielectric layer 200 (e.g., as shown in FIG. 11).

Figure 8:
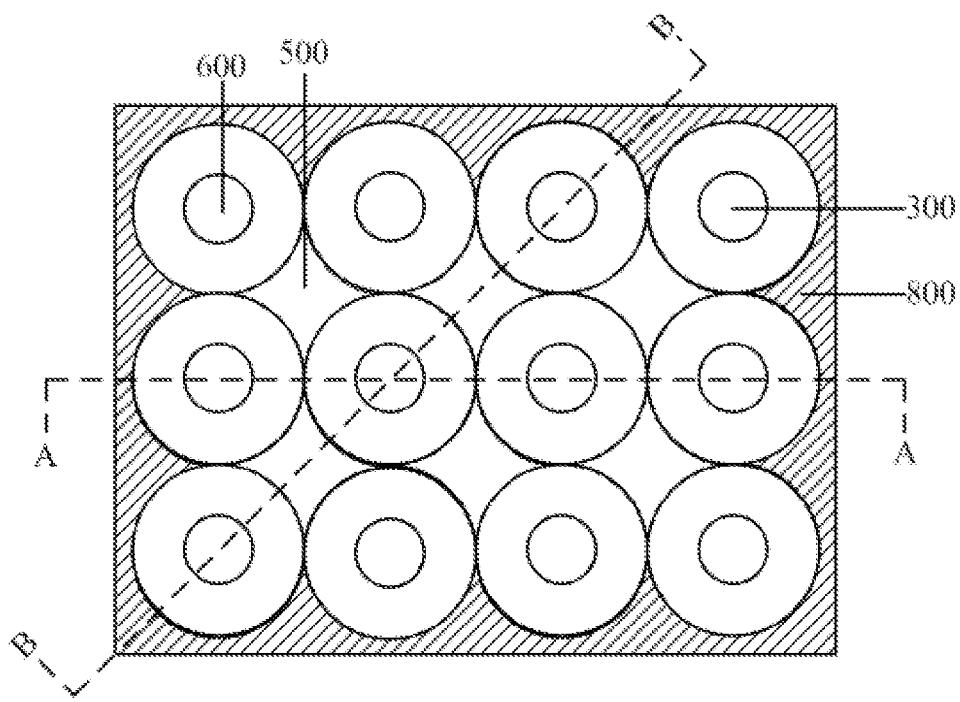
FIG. 8 depicts a top view of an exemplary semiconductor device after removal of pillar structures in accordance with various disclosed embodiments.
Figure 9:
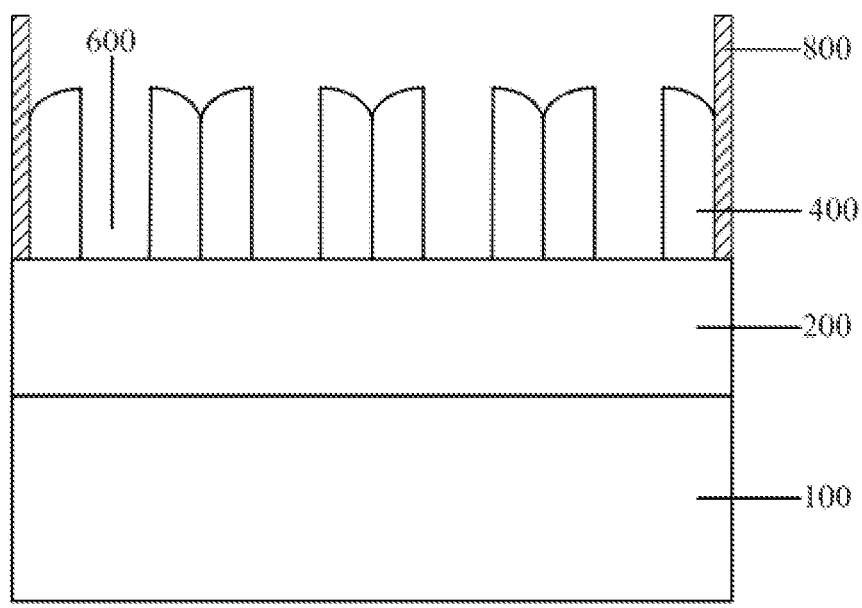
FIG. 9 depicts a cross-sectional view of the exemplary semiconductor device along an AA direction as shown in FIG. 8 in accordance with various disclosed embodiments.
Figure 10:
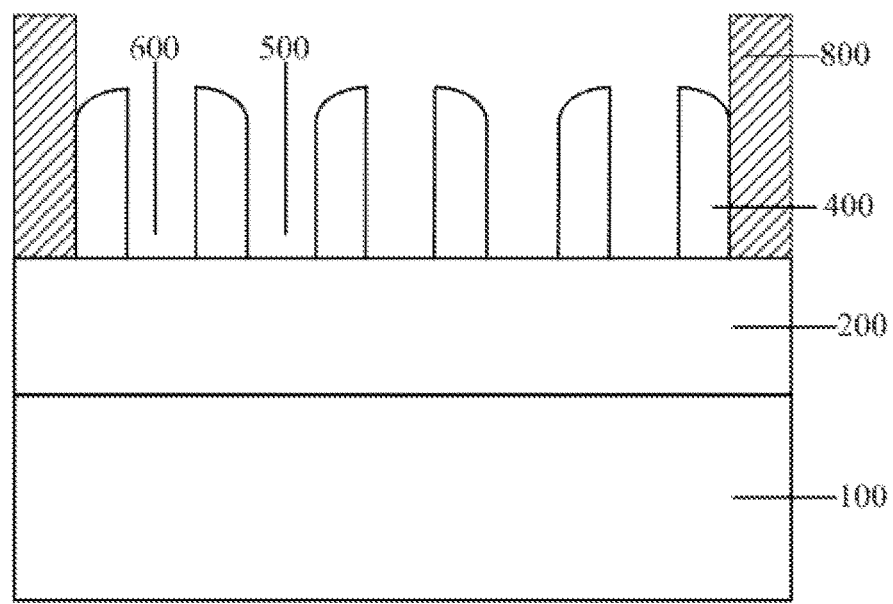
FIG. 10 depicts a cross-sectional view of the exemplary semiconductor device along a BB direction as shown in FIG. 8 in accordance with various disclosed embodiments.

FIG. 8 depicts a top view of an exemplary semiconductor device after the removal of pillar structures in accordance with various disclosed embodiments. FIG. 9 depicts a cross-sectional view of the exemplary semiconductor device along an AA direction as shown in FIG. 8. FIG. 10 depicts a cross-sectional view of the exemplary semiconductor device along a BB direction as shown in FIG. 8.

In Step S15 of FIG. 1 and referring to FIGS. 8-10, the pillar structures 300 are removed.

In one embodiment, the pillar structures 300 can be made of a photoresist material, and thus can be removed by the ashing process and/or other suitable processes. After the pillar structures 300 are removed, a through hole 600 can be formed at a position corresponding to a removed pillar structure 300.

A pattern formed by the through holes 500 and the through holes 600 can be transferred into the dielectric layer 200 by an etching process using the sidewall spacers 400 as an etch mask. To protect a region at edge of the dielectric layer 200 from being damaged, a protective layer 800 (shown in FIGS. 8-10) can be formed at the edge of the dielectric layer 200. The protective layer 800 can be used to protect the dielectric layer 200 at a corresponding position from being affected during the pattern transfer process.

It should be noted that, the accompanying drawings in the present disclosure may illustrate all or part of the semiconductor device, and may show an interconnect region (i.e., a region where high-density metal plugs or metal interconnects can be formed). The protective layer 800 may need to be formed outside the interconnect region, and cannot be formed within the interconnect region. Thus, transferring of the through holes 500 and the through holes 600 into the dielectric layer 200 can be unaffected, and the dielectric layer 200 corresponding to a region outside the interconnect region can be unaffected.

In some embodiments, the protective layer 800 can be made of a photoresist material, and can be formed by a photolithography process. In other embodiments, the protective layer 800 can be made of other suitable materials, which are not limited in the present disclosure.

Figure 12:
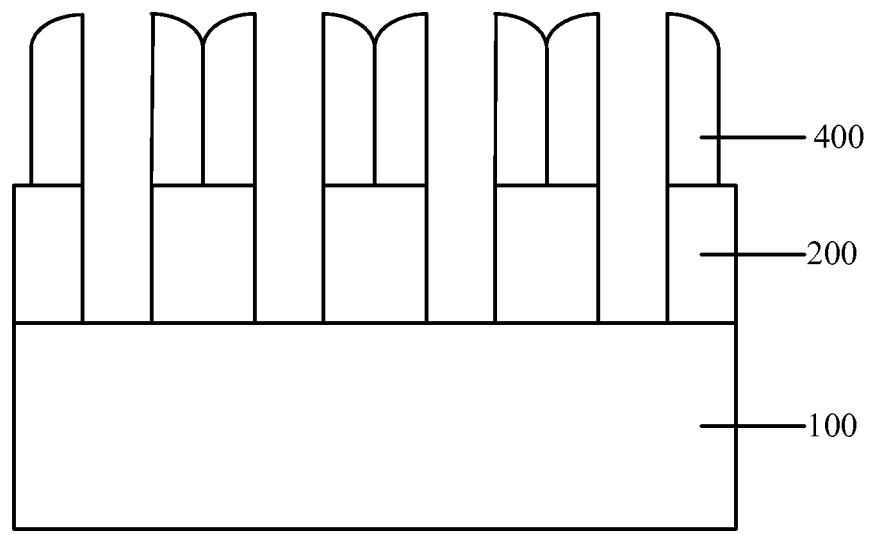
FIG. 12 depicts a cross-sectional view of the exemplary semiconductor device along an AA direction as shown in FIG. 11 in accordance with various disclosed embodiments.
Figure 13:
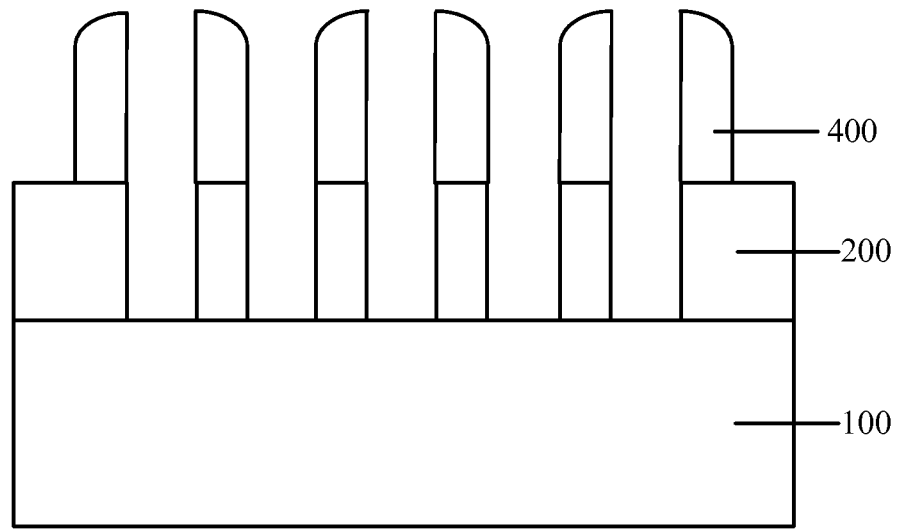
FIG. 13 depicts a cross-sectional view of an exemplary semiconductor device along a BB direction as shown in FIG. 11 in accordance with various disclosed embodiments.

FIG. 11 depicts a top view of the exemplary semiconductor device after the etching of the dielectric layer in accordance with various disclosed embodiments. FIG. 12 depicts a cross-sectional view of the exemplary semiconductor device along an AA direction as shown in FIG. 11. FIG. 13 depicts a cross-sectional view of the exemplary semiconductor device along a BB direction as shown in FIG. 11.

In Step S16 of FIG. 1 and referring to FIG. 11-13, the dielectric layer 200 is etched using the protective layer 800 and the sidewall spacers 400 as an etch mask. The pattern of the through holes 500 and the through holes 600 can thus be transferred into the dielectric layer 200 to form through holes 750 in the dielectric layer 200 (corresponding to the through holes 500) and to form through holes 760 in the dielectric layer 200 (corresponding to the through holes 600). In this example, a total number of the through holes 750 and the through holes 760 can be about 18, which can be a significant increase compared with the number 12 of the original pillar structures 300. Thus, the density of the through holes in the dielectric layer 200 can be increased by about 50%.

When the pillar structures 300 are arranged in M rows by N columns, about (M−1)×(N−1) through holes 500 can be newly added. As a result, the density of the through holes in the dielectric layer 200 can be increased by $$\frac{(M-1)\times(N-1)}{M\times N}\times 100\%.$$

Therefore, as the number of the pillar structures 300 is increased, the density of the through holes formed in the dielectric layer 200 can be further increased. For example, when about 100×100 pillar structures 300 are arranged, about 99×99 through holes can be newly added. In this case, the density of the through holes is increased by about 98.1%.

In one embodiment, the through holes 750 and the through holes 760 can be formed using a dry etch and/or wet etch. After the through holes 750 and the through holes 760 are formed, the protective layer 800 (e.g., as shown in FIG. 8) can be removed.

In one embodiment, trenches can be formed in the dielectric layer 200 corresponding to the through holes 500 and the through holes 600. The trenches may or may not penetrate through the dielectric layer 200. When the pillar structures 300 are arranged in M rows by N columns, about (M−1)×(N−1) trenches can be newly added. As a result, the density of the trenches in the dielectric layer 200 can be also increased by $$\frac{(M-1)\times(N-1)}{M\times N}\times 100\%.$$

In various embodiments, a self-aligned double patterning process (e.g., as shown in Steps S13-S16 in FIG. 1) is included. During the self-aligned double patterning process, the pillar structures can be formed having a matrix arrangement on the dielectric layer. The sidewall spacer can be formed on the sidewall surface of each of the pillar structures. By controlling the distance between every two adjacent pillar structures in the same row or in the same column to be less than or equal to the double of the thickness of the sidewall spacer, a through hole can be formed between every four pillar structures arranged in two adjacent rows and in two adjacent columns (e.g., in a sub-matrix). Therefore, after the pillar structures are removed, trenches (e.g., pillar-like trenches) or through holes can be formed in the dielectric layer. The trenches or through holes may correspond to the pillar structures and correspond to the through holes formed by every four pillar structures. Density of trenches or through holes can be increased.

Figure 14:
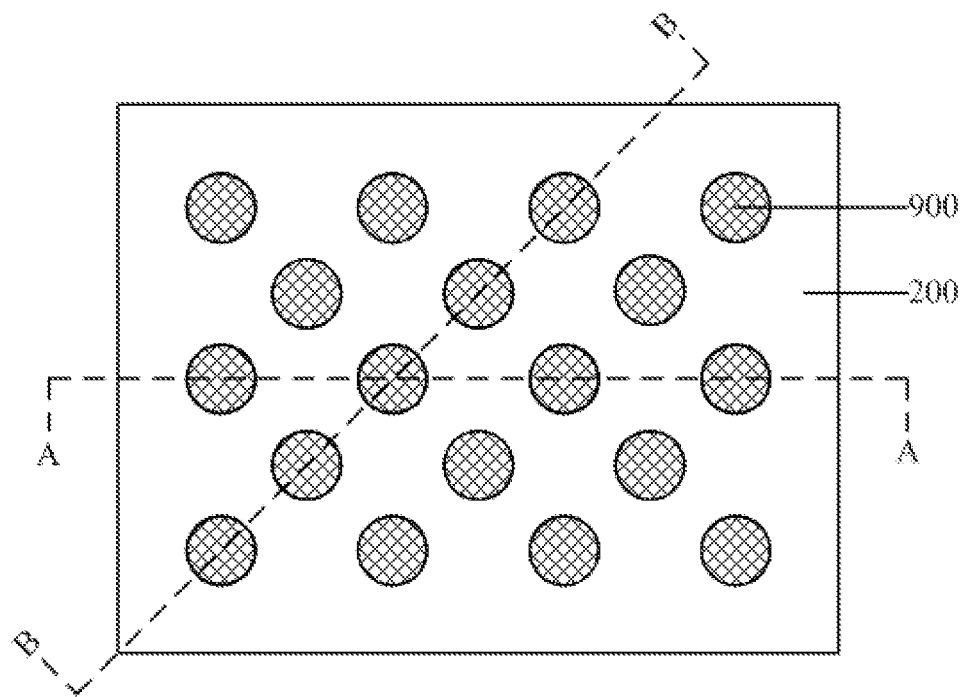
FIG. 14 depicts a top view of an exemplary semiconductor device after forming a metal material in accordance with various disclosed embodiments.
Figure 15:
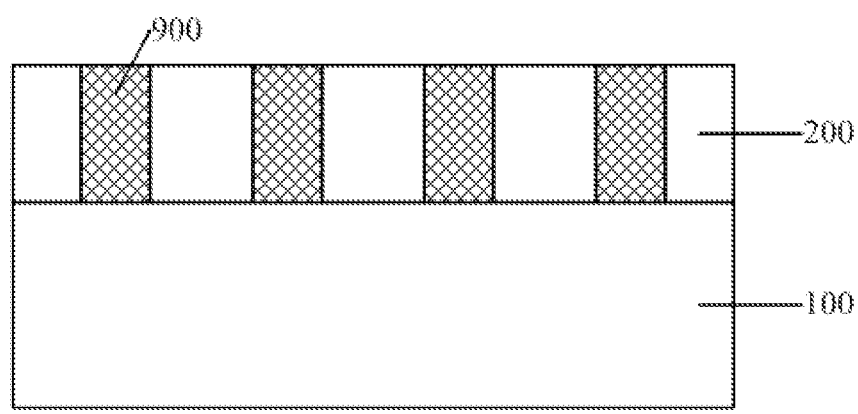
FIG. 15 depicts a cross-sectional view of the exemplary semiconductor device along an AA direction as shown in FIG. 14 in accordance with various disclosed embodiments.
Figure 16:
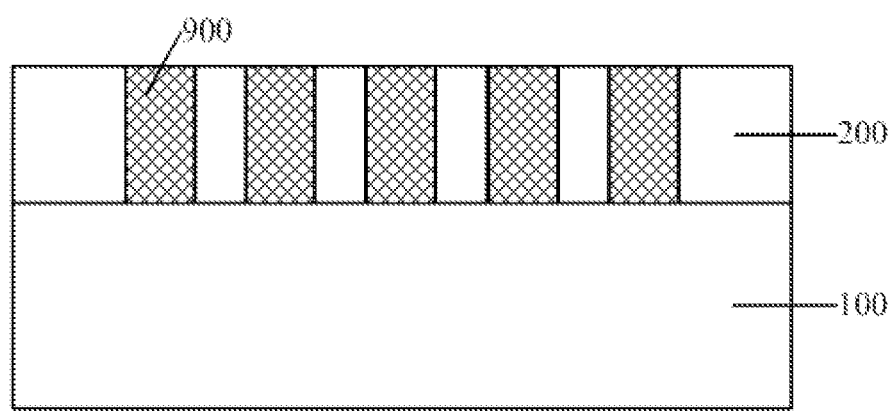
FIG. 16 depicts a cross-sectional view of an exemplary semiconductor device along a BB direction as shown in FIG. 14 in accordance with various disclosed embodiments.

For example, FIG. 14 depicts a top view of an exemplary semiconductor device after the formation of a metal material in accordance with various disclosed embodiments. FIG. 15 depicts a cross-sectional view of the exemplary semiconductor device along an AA direction as shown in FIG. 14. FIG. 16 depicts a cross-sectional view of the exemplary semiconductor device along a BB direction as shown in FIG. 14.

In Step S17 of FIG. 1 and referring to FIGS. 14-16, the sidewall spacers 400 are removed. In various embodiments, optionally, the through holes 750 and the through holes 760 can be filled with a metal material 900. Using a planarization process, a top surface of the metal material 900 can be leveled with a top surface of the dielectric layer 200.

In one embodiment, the metal material 900 can used as metal plugs and can be made of copper, aluminum, copper alloy, and/or aluminum alloy. In one embodiment, when the trenches are formed in the dielectric layer 200 instead of the through holes, the metal material 900 can be used as interconnects. High-density through holes or trenches can be formed in the dielectric layer 200 using simple and low-cost processes.

In various embodiments, the disclosed methods can be applicable to back-end-of-line (BEOL) of NAND (i.e., Not AND, a type of flash memory), and thus can increase density of metal plugs, reduce fabrication complexity, and ultimately increase degree of device integration and reduce device size. Furthermore, using the disclosed methods, interconnect structures of Damascene structures can be formed without limitation.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:
1. A method for fabricating a semiconductor device, comprising:
  providing a semiconductor substrate;
  forming a dielectric layer on the semiconductor substrate;
  forming a plurality of pillar structures having a matrix arrangement on the dielectric layer;
  forming a plurality of sidewall spacers on the dielectric layer, wherein each sidewall spacer of the plurality of sidewall spacers is formed on a sidewall surface of one of the plurality of pillar structures, and wherein a distance between two adjacent pillar structures in a same row or in a same column is less than or equal to a double of a thickness of the each sidewall spacer on the sidewall surface;
  forming a protective layer on the dielectric layer and outside an interconnect region containing the plurality of sidewall spacers, wherein the protective layer contacts and encloses the sidewall spacers of a subset of the plurality of pillar structures that are outermost pillar structures of the matrix arrangement;

removing the plurality of pillar structures; and etching the dielectric layer using the plurality of sidewall spacers and the protective layer as an etch mask to form a plurality of trenches or through holes through the dielectric layer.

2. The method of claim 1, wherein the plurality of sidewall spacers is made of a material including silicon oxide, silicon nitride, silicon oxynitride, silicon carbide, silicon carbonitride, titanium nitride, copper nitride, or a combination thereof.

3. The method of claim 1, wherein the plurality of sidewall spacers is formed by an atomic layer deposition process.

4. The method of claim 1, wherein the plurality of pillar structures has a circular, oval, or diamond cross-sectional shape.

5. The method of claim 1, wherein the plurality of pillar structures includes a plurality of cylinders and has a diameter ranging from about 10 nm to about 180 nm.

6. The method of claim 1, wherein the dielectric layer is made of a material including silicon oxide, black diamond, carbon-containing silicon oxide, or a combination thereof.

7. The method of claim 1, wherein the plurality of pillar structures and the plurality of sidewall spacers are made of a different material.

8. The method of claim 7, wherein the plurality of pillar structures is made of a material including silicon oxide, silicon nitride, silicon oxynitride, silicon carbide, silicon carbonitride, titanium nitride, copper nitride, or a combination thereof.

9. The method of claim 1, wherein:

the plurality of pillar structures is made of a material including photoresist, amorphous carbon, silicon oxide formed by tetraethyl orthosilicate (TEOS), or a combination thereof, and the removing of the plurality of pillar structures includes an ashing process.

10. The method of claim 1, wherein, after the plurality of trenches or through holes are formed in the dielectric layer, the method further includes:

filling the plurality of trenches or through holes with a metal material to form interconnects in the interconnect region.

11. The method of claim 1, wherein:

the protective layer is formed at the edge of the dielectric layer.

12. The method of claim 1, wherein:

the protective layer is not formed within the interconnect region.

13. The method of claim 1, wherein:

the protective layer is made of a photoresist material.

14. The method of claim 1, wherein:

the plurality of pillar structures having the matrix arrangement are arranged in M rows by N columns, and a total number of the plurality of trenches or through holes is (M−1)×(N−1) plus (M×N).

15. The method of claim 1, wherein:

the plurality of pillar structures having the matrix arrangement are arranged in M rows by N columns, and a number of the subset of the plurality of pillar structures is 2×(M+N−2).

* * * * *